(12) United States Patent
Choi

(10) Patent No.: US 9,310,430 B2
(45) Date of Patent: Apr. 12, 2016

(54) SEMICONDUCTOR INTEGRATED CIRCUIT AND TEST CONTROL METHOD THEREOF

(75) Inventor: Hong-Sok Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 300 days.

(21) Appl. No.: 13/444,944

(22) Filed: Apr. 12, 2012

(65) Prior Publication Data

US 2013/0162274 A1 Jun. 27, 2013

(30) Foreign Application Priority Data

Dec. 21, 2011 (KR) .................. 10-2011-0139617

(51) Int. Cl.
*G01R 31/00* (2006.01)
*G01R 31/317* (2006.01)

(52) U.S. Cl.
CPC ................... *G01R 31/31701* (2013.01)

(58) Field of Classification Search
CPC .................. G01R 31/31924; G01R 31/31922; G01R 35/00
USPC ..................................... 324/750.01
See application file for complete search history.

(56) References Cited

U.S. PATENT DOCUMENTS

| 3,067,937 | A | * | 12/1962 | Hinkein et al. ............... 712/220 |
| 4,456,994 | A | * | 6/1984 | Segarra ............................ 714/33 |
| 5,005,193 | A | * | 4/1991 | Simpson ......................... 377/33 |
| 5,422,881 | A | * | 6/1995 | May et al. ..................... 370/392 |
| 5,467,468 | A | | 11/1995 | Koshikawa |
| 6,438,667 | B1 | * | 8/2002 | Shinozaki ...................... 711/163 |
| 8,151,151 | B2 | * | 4/2012 | Warren ........................... 714/724 |
| 8,639,369 | B1 | * | 1/2014 | Clark ............................... 700/94 |
| 2003/0154465 | A1 | * | 8/2003 | Bollano et al. ................ 717/137 |
| 2004/0164760 | A1 | * | 8/2004 | Moore ........................... 324/765 |
| 2005/0065748 | A1 | * | 3/2005 | Hong ............................. 702/124 |
| 2007/0115735 | A1 | * | 5/2007 | Kishigami ..................... 365/201 |
| 2007/0126429 | A1 | * | 6/2007 | Tanaka .......................... 324/527 |
| 2010/0002819 | A1 | * | 1/2010 | Conner .......................... 375/355 |
| 2010/0032669 | A1 | * | 2/2010 | An et al. ......................... 257/48 |
| 2010/0238297 | A1 | * | 9/2010 | Gou et al. ...................... 348/181 |
| 2010/0332925 | A1 | * | 12/2010 | Lee et al. ....................... 714/718 |
| 2011/0227593 | A1 | * | 9/2011 | Song et al. ............... 324/750.15 |
| 2012/0081137 | A1 | * | 4/2012 | Pagani et al. ............ 324/750.01 |
| 2012/0119764 | A1 | * | 5/2012 | Yun et al. ................. 324/750.01 |
| 2013/0082801 | A1 | * | 4/2013 | Rofougaran et al. ......... 333/239 |

FOREIGN PATENT DOCUMENTS

| KR | 1020080113969 | 12/2008 |
| KR | 1020100055036 | 5/2010 |

* cited by examiner

*Primary Examiner* — Tung X Nguyen
*Assistant Examiner* — Dominic Hawkins
(74) *Attorney, Agent, or Firm* — IP & T Group LLP

(57) ABSTRACT

A semiconductor integrated circuit includes a decoding circuit configured to decode one or more test source signals and generate a plurality of test decoding signals, a transmission circuit configured to transmit the plurality of test decoding signals as a plurality of test mode group signals in response to a test enable signal, wherein the transmission circuit outputs the test mode group signals with maintaining a previous output, when the test decoding signals different from each other are sequentially activated, and a test mode signal output circuit configured to output a plurality of test mode signals corresponding to test mode groups, respectively, in response to the plurality of test mode group signals and one or more test mode select signals.

17 Claims, 8 Drawing Sheets

FIG. 3
(PRIOR ART)

|  | TMSEL0 | TMSEL1 | TMSEL2 | TMSEL3 |
|---|---|---|---|---|
| TMGRP1 | TESTMODE_1_0 | TESTMODE_1_1 | TESTMODE_1_2 | TESTMODE_1_3 |
| TMGRP2 | TESTMODE_2_0 | TESTMODE_2_1 | TESTMODE_2_2 | TESTMODE_2_3 |
| TMGRP3 | TESTMODE_3_0 | TESTMODE_3_1 | TESTMODE_3_2 | TESTMODE_3_3 |
| TMGRP62 | TESTMODE_62_0 | TESTMODE_62_1 | TESTMODE_62_2 | TESTMODE_62_3 |
| TMGRP63 | TESTMODE_63_0 | TESTMODE_63_1 | TESTMODE_63_2 | TESTMODE_63_3 |

FIG. 8

| | TMSEL0 | TMSEL1 | TMSEL2 | TMSEL3 |
|---|---|---|---|---|
| TMGRP1 | TESTMODE_1_0 | TESTMODE_1_1 | TESTMODE_1_2 | TESTMODE_1_3 |
| TMGRP2 | TESTMODE_2_0 | TESTMODE_2_1 | TESTMODE_2_2 | TESTMODE_2_3 |
| TMGRP3 | TESTMODE_3_0 | TESTMODE_3_1 | TESTMODE_3_2 | TESTMODE_3_3 |

| | | | | |
|---|---|---|---|---|
| TMGRP62 | TESTMODE_62_0 | TESTMODE_62_1 | TESTMODE_62_2 | TESTMODE_62_3 |
| TMGRP63 | TESTMODE_63_0 | TESTMODE_63_1 | TESTMODE_63_2 | TESTMODE_63_3 |

SEMICONDUCTOR INTEGRATED CIRCUIT AND TEST CONTROL METHOD THEREOF

CROSS-REFERENCE TO RELATED APPLICATIONS

The present application claims priority of Korean Patent Application No. 10-2011-0139617, filed on Dec. 21, 2011, which is incorporated herein by reference in its entirety.

BACKGROUND

1. Field

Exemplary embodiments of the present invention relate to semiconductor design technology, and more particularly, to a semiconductor integrated circuit and a test control method thereof.

2. Description of the Related Art

In general, a semiconductor integrated circuit includes a separate test circuit for a test as well as normal circuits performing its own functions such as storing data, and the test circuit uses a test mode signal different from a normal mode signal for the normal circuits.

Meanwhile, the semiconductor integrated circuit supports various types of test modes, such as a test mode for controlling a voltage and a test mode for compressing data, in order to increase test efficiency. The semiconductor integrated circuit includes a test mode signal generator configured to generate test mode signals for entering a specific test mode or resetting the test mode, among the test modes.

FIG. 1 is a block diagram of a test mode signal generator for generating a test mode signal.

Referring to FIG. 1, the test modes signal generator includes a decoding circuit 10 and an output circuit 20. The decoding circuit 10 is configured to decode, for example, a 6-bit test source signal TMDEC<0:5> and generate, for example, 63 ($2^6-1$) test mode group signals TMGRPi (i=1~63), and the output circuit 20 is configured to combine the 63 test mode group signals TMGRPi and 4 test mode select signals TMSELj (j=0~3) and output 252 (63*4) test mode signals TESTMODEij. Though FIG. 1 illustrates only the output circuit 20 including four output units 22, 24, 26, and 28 for receiving four test mode select signals TMSELj, 62 output circuits 20 each including 4 output units 22, 24, 26, and 28 are further provided, and the 63 output circuits 20 are controlled by the 63 test mode group signals TMGRPi, respectively.

Meanwhile, the number of test mode group signals TMGRPi may be typically set to 63 after decoding, because a case that the decoding result or combination result is '0,' is not used.

Hereinafter, an operation of the test mode signal generator having the above-described configuration will be described with reference to FIG. 2.

FIG. 2 is a timing diagram illustrating the operation of the test mode signal generator shown in FIG. 1.

Referring to FIG. 2, when 4 test mode select signals TMSELj may be combined in a set manner, that is, one or more of the 4 test mode select signals TMSELj are activated to a logic high level, the output circuit 20 waits for an output in a state that the activated test mode signals TMSELj are latched.

In such a state, when the 6-bit test source signal TMDEC<0:5> may be combined in a set manner, the decoding circuit 10 activates one of the 63 test mode group signals TMGRPi in response to the combined 6-bit test source signal TMDEC<0:5>.

Then, only one output circuit outputs the latched test mode select signals TMSELj as the test mode signals TESTMODEij in response to the activated test mode group signal TMGRPi.

Accordingly, a semiconductor integrated circuit enters one or more test modes among four test modes belonging to a specific test mode group, in response to a test mode signal TESTMODEij which is outputted at a logic high level among the outputted four test mode signals TESTMODEij.

Then, when entering test modes belonging to another test mode group, the semiconductor integrated circuit performs a test mode rest process TMRST. When the test mode reset process TMRST is performed, the test source signal TMDEC<0:5> and the test mode select signals TMSELj are reset to a logic low level.

In such a state, the 4 test mode select signals TMSELj are generated in another combination set, the 63 output circuits wait for an output in a state that the activated test mode select signals TMSELj are latched.

Subsequently, when the 6-bit test source signal TMDEC<0:5> are generated in another combination set, the decoding circuit 10 activates another of the 63 test mode group signals TMGRPi in response to the combined 6-bit test source signal TMDEC<0:5>.

Then, another output circuit outputs the latched test mode select signals TMSELj as the test mode signals TESTMODEij in response to the activated test mode group signal TMGRPi.

Accordingly, the semiconductor integrated circuit enters one or more test modes among four test modes belonging to another test mode group in response to a test mode signal TESTMODEij which is outputted at a logic high level among the outputted 4 test mode signals TESTMODEij.

Since the semiconductor integrated circuit may generate several hundred kinds of local test mode signals TESTMODEij with a small number of global signals TMDEC<0:5>and TMSEL<0:3>, the area thereof may be reduced.

In a state of entering a test mode belonging to a specific test mode group, however, the conventional semiconductor integrated circuit may not concurrently enter a test mode belonging to another test mode group. That is, the conventional semiconductor integrated circuit should apply a new combination of the six test mode signals TMDEC<0:5> and the four test mode select signals TMSELj, in order to enter a test mode of another test mode group in a state of entering a test mode of the specific test mode group. Therefore, the test mode reset process TMRST for resetting the entered test mode should be preceded. Accordingly, as the test mode reset process TMRST should be performed, the semiconductor integrated circuit may not concurrently enter test modes belonging to different test mode groups, as shown in FIG. 3. That is, the semiconductor integrated circuit may not maintain the test modes of different test mode groups at the same time even though the time points of entering the respective test modes are different.

Furthermore, the test mode reset process TMRST may be performed by resetting the test source signal TMDEC<0:5> and the test mode select signals TMSELj, for example, changing the signals to a logic low level or maintaining the signals at a logic low level. Therefore, although the semiconductor integrated circuit may concurrently enter two or more test modes among a plurality of test modes belonging to the same test mode group, in response to a combination of the test mode select signals TMSELj, the semiconductor integrated circuit may not selectively reset the test modes during the test mode reset process TMRST.

SUMMARY

An embodiment of the present invention is directed to a semiconductor integrated circuit capable of concurrently entering test modes belonging to different test mode groups.

Another embodiment of the present invention is directed to a semiconductor integrated circuit capable of selectively resetting test modes belonging to the same test mode group in the state of entering the test modes concurrently.

In accordance with an exemplary embodiment of the present invention, a semiconductor integrated circuit includes a decoding circuit configured to decode one or more test source signals and generate a plurality of test decoding signals, a transmission circuit configured to transmit the plurality of test decoding signals as a plurality of test mode group signals in response to a test enable signal, wherein the transmission circuit outputs the test mode group signals with maintaining a previous output, when the test decoding signals different from each other are sequentially activated; and a test mode signal output circuit configured to output a plurality of test mode signals corresponding to test mode groups, respectively, in response to the plurality of test mode group signals and one or more test mode select signals. Furthermore, the transmission circuit is configured to output the test mode group signals with resetting the previous output, when the same test decoding signal is sequentially activated.

In accordance with another exemplary embodiment of the present invention, a test control method of a semiconductor integrated circuit includes activating a first test mode group signal among a plurality of test mode group signals for a first test mode group including a plurality of first test modes, latching the first test mode group signal; activating a first test mode signal for entering one or more of the first test modes, in response to a plurality of test mode select signals and the first test mode group signal latched in the latching of the first test mode group signal; activating a second test mode group signal among the plurality of test mode group signals for a second test mode group including a plurality of second test modes; latching the second test mode group signal, and activating a second test mode signal for entering one or more of the second test modes, in response to the plurality of test mode select signals and the second test mode group signal latched in the latching of the second test mode group signal. In the activating of the second test mode group signal, the latching of the second test mode group signal, and the activating of the second test mode signal, the first test mode signal is maintained to be activated.

In accordance with yet another exemplary embodiment of the present invention, a test control method of a semiconductor integrated circuit includes activating a first test mode group signal of a first period among a plurality of test mode group signals for a first test mode group including a plurality of test modes, first latching the first test mode group signal, activating a first test mode signal for entering one of the test modes, in response to a plurality of test mode select signals and the first test mode group signal latched in the first latching of the activating the first test mode group signal, activating the first test mode group signal of a second period; deactivating the first test mode signal in response to the first test mode group signal of the second period, and second latching the first test mode group signal of the second period, and activating a second test mode signal for entering another of the test modes, in response to the test mode select signals and the first test mode group signal latched in the second latching.

BRIEF DESCRIPTION OF THE DRAWINGS

FIG. 3 is a table showing a state that the conventional semiconductor integrated circuit does not concurrently enter test modes belonging to different test mode groups.

FIG. 8 is a table showing a state that the semiconductor integrated circuit in accordance with the exemplary embodiment of the present invention concurrently enters test modes belonging to different test modes.

DETAILED DESCRIPTION

Figure 1:
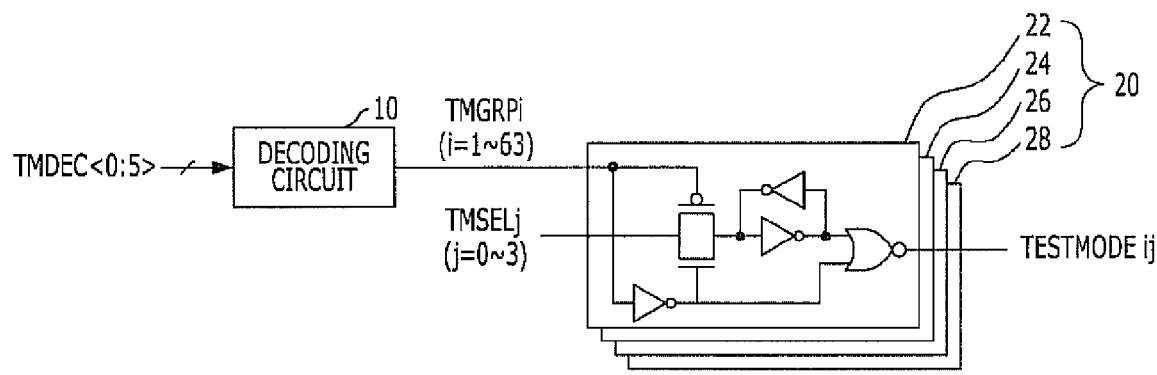
FIG. 1 is an internal diagram of a conventional semiconductor integrated circuit.
Figure 2:
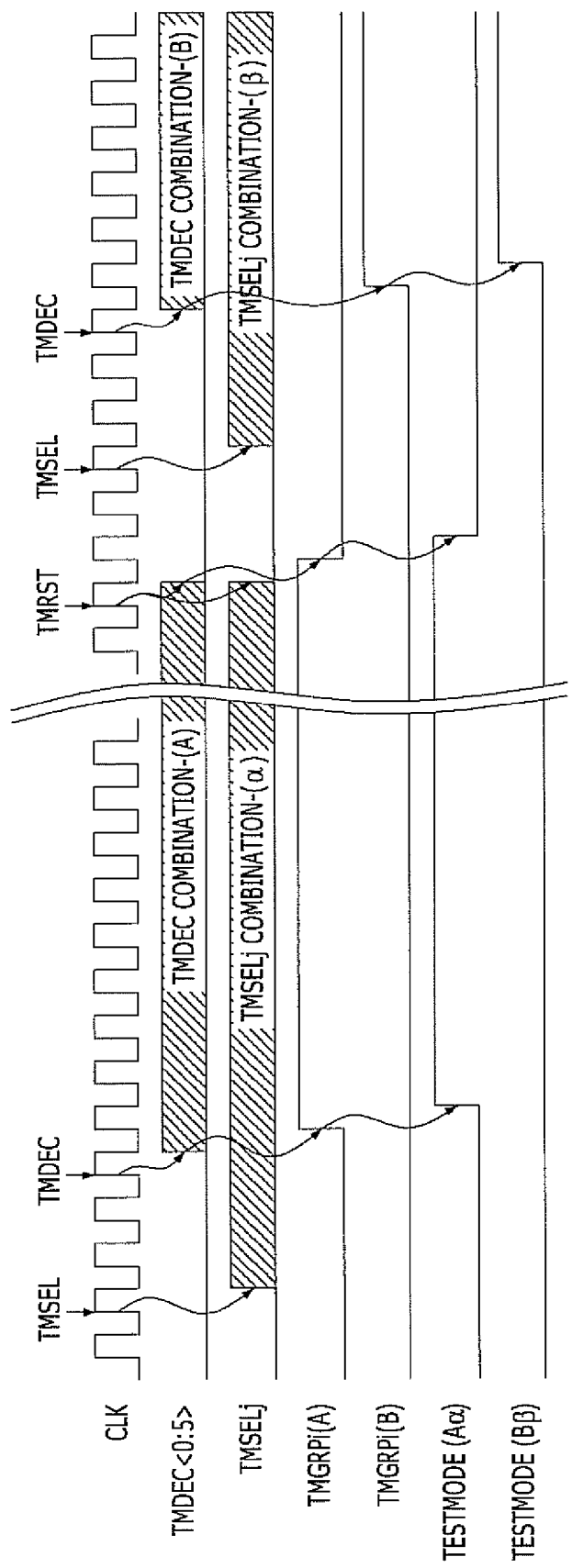
FIG. 2 is a timing diagram illustrating the operation of the conventional semiconductor integrated circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
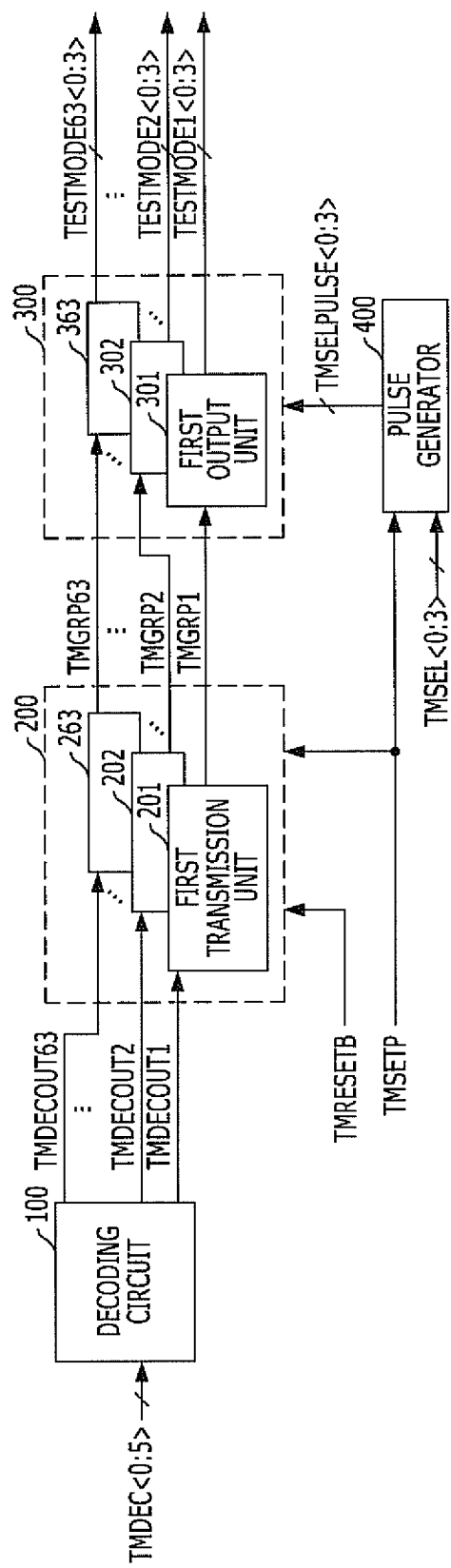
FIG. 4 is a block diagram of a semiconductor integrated circuit in accordance with an exemplary embodiment of the present invention.

FIG. 4 is a block diagram of a semiconductor integrated circuit in accordance with an exemplary embodiment of the present invention.

Referring to FIG. 4, the semiconductor integrated circuit includes a decoding circuit 100, a transmission circuit 200, a test mode signal output circuit 300, and a pulse generator 400.

The decoding circuit 100 is configured to decode a 6-bit test source signal TMDEC<0:5> and generate 1st to 63rd test decoding signals TMDECOUT1 to TMDECOUT63.

The transmission circuit 200 is configured to transmit the 1st to 63rd test decoding signals TMDECOUT1 to TMDECOUT63 as 1st to 63rd test mode group signals TMGRP1 to TMGRP63 in response to a test enable signal TMSETP. When test decoding signals different from each other among the 1st to 63rd test decoding signals TMDECOUT1 to TMDECOUT63 are sequentially activated, the transmission circuit 200 transmits a newly-activated test decoding signal with the previously-activated test decoding signal. That is, the transmission circuit outputs a corresponding test mode group signal with maintaining an output of a previous test mode group signal. When one of the 1st to 63rd test decoding signals TMDECOUT1 to TMDECOUT63 is successively activated, the transmission circuit 200 transmits the activated test decoding signal as it is. That is, the transmission circuit outputs a corresponding test mode group signal with resetting the previous output of the test mode group signal.

The test mode signal output circuit 300 is configured to output 1st to 252nd test mode signals TESTMODE1<0:3> to TESTMODE63<0:3> corresponding to 63 test mode groups in response to the 1st to 63rd test mode group signals TMGRP1 to TMGRP63 and first to fourth test mode select pulse signals TMSELPULSE<0:3>. The pulse generator 400 is configured to output the first to fourth test mode select signals TMSEL<0:3> as the first to fourth test mode select pulse signals TMSELPULSE<0:3> in response to the test enable signal TMSETP.

Here, the decoding circuit 100 generates the 63 test decoding signals TMDECOUT1 to TMDECOUT63 corresponding to the 6-bit test source signal TMDEC<0:5> using a decoding method. At this time, 64 ($2^6$) test decoding signals may be generated. However, since the 6-bit test source signal TMDEC<0:5> which are all at a logic low level are not used, only 63 ($2^6-1$) test decoding signals are generated.

The transmission circuit 200 includes 1st to 63rd transmission units 201 to 263 corresponding to the 1st to 63rd test decoding signals TMDECOUT1 to TMDECOUT63, and the test mode signal output circuit 300 includes 1st to 63rd output units 301 to 363 corresponding to the 1st to 63rd test mode group signals TMGRP1 to TMGRP63. At this time, the 1st to 63rd transmission units 201 to 263 have the same configuration, and the 1st to 63rd output units 301 to 363 have the same configuration. Therefore, the first transmission unit 201 and the first output unit 301 are described as follows, for illustrative purpose.

Figure 5:
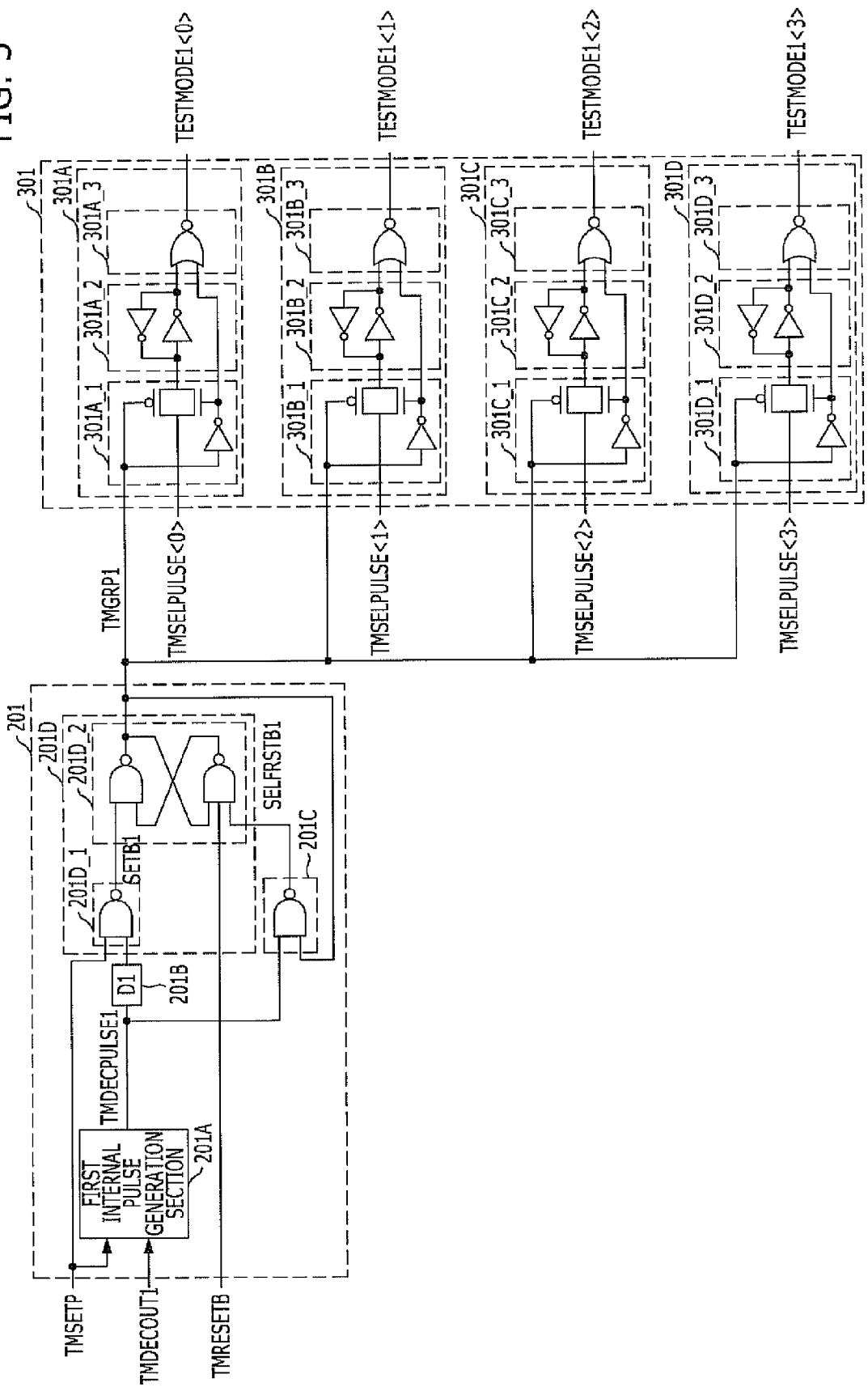
FIG. 5 is an internal circuit diagram of a first transmission unit and a second output unit shown in FIG. 4.

FIG. 5 is an internal circuit diagram of the first transmission unit 201 and the first output unit 301 illustrated in FIG. 4.

Referring to FIG. 5, the first transmission unit 201 includes a first internal pulse generation section 201A, a delay section 201B, a first self reset section 201C, and a first test mode group signal generation section 201D.

The first internal pulse generation section 201A is configured to output the first test decoding signal TMDECOUT1 as a first test decoding pulse signal TMDECPULSE1 in response to the test enable signal TMSETP. The delay section 201B is configured to delay the first test decoding pulse signal TMDECPULSE1 by a set period. The first self reset section 201C is configured to generate a first self reset signal SELFRSTB1 in response to the first test decoding pulse signal TMDECPULSE1 and the first test mode group signal TMGRP1. The first test mode group signal generation section 201D is configured to generate the first test mode group signal TMGRP1 in response to the first self reset signal SELFRSTB1, the test enable signal TMSETP, and an output signal of the delay section 201B.

Here, the first test mode group signal generation section 201D includes a first input section 201D_1 configured to receive the first test decoding pulse signal TMDECPULSE1 in response to the test enable signal TMSETP and a first S/R latch section 201D_2 configured to be set in response to a first set signal SETB1 outputted from the first input section 201D_1 and reset in response to the first self reset signal SELFRSTB1. In particular, the first S/R latch section 201D_2 may be directly reset in response to a common reset signal TMRESETB. Meanwhile, the delay section 201B serves to maintain the activation state of the first set signal SETB1, that is, a logic low level, during a certain period such that the state of the first S/R latch section 201D_2, which is set by the first set signal SETB1, is not immediately reset by the first self reset signal SELFRSTB1.

Furthermore, the first output unit 301 includes first to fourth output sections 301A to 301D, and the first to fourth output sections 301A to 301D include first to fourth switching sections 301A_1 to 301D_1, first to fourth latch sections 301A_2 to 301D_2, and first to fourth final output sections 301A_3 to 301D_3, respectively.

The first to fourth switching sections 301A_1 to 301D_1 are configured to respectively transmit the first to fourth test mode select pulse signals TMSELPULSE<0:3> in response to the first test mode group signal TMGRP1 transmitted from the first transmission unit 201. The first to fourth latch sections 301A_2 to 301D_2 are configured to respectively latch the first to fourth test mode select pulse signals which are transmitted through the first to fourth switching sections 301A_1 to 301D_1. The first to fourth final output sections 301A_3 to 301D_3 are configured to respectively output the first to fourth test mode signals TESTMODE1<0:3> in response to the first to fourth test mode select pulse signals latched in the first to fourth latch sections 301A_2 to 301D_2 and the first test mode group signal TMGRP1. The first output unit 301 having the above-described configuration latches the first to fourth test mode select pulse signals TMSELPULSE<0:3> and outputs the latched first to fourth test mode select pulse signals as the first to fourth test mode signals TESTMODE1<0:3> in response to the first test mode group signal TMGRP1.

Hereinafter, a test control method of the semiconductor integrated circuit in accordance with the embodiment of the present invention will be described with reference to FIGS. 6 to 8.

Figure 6:
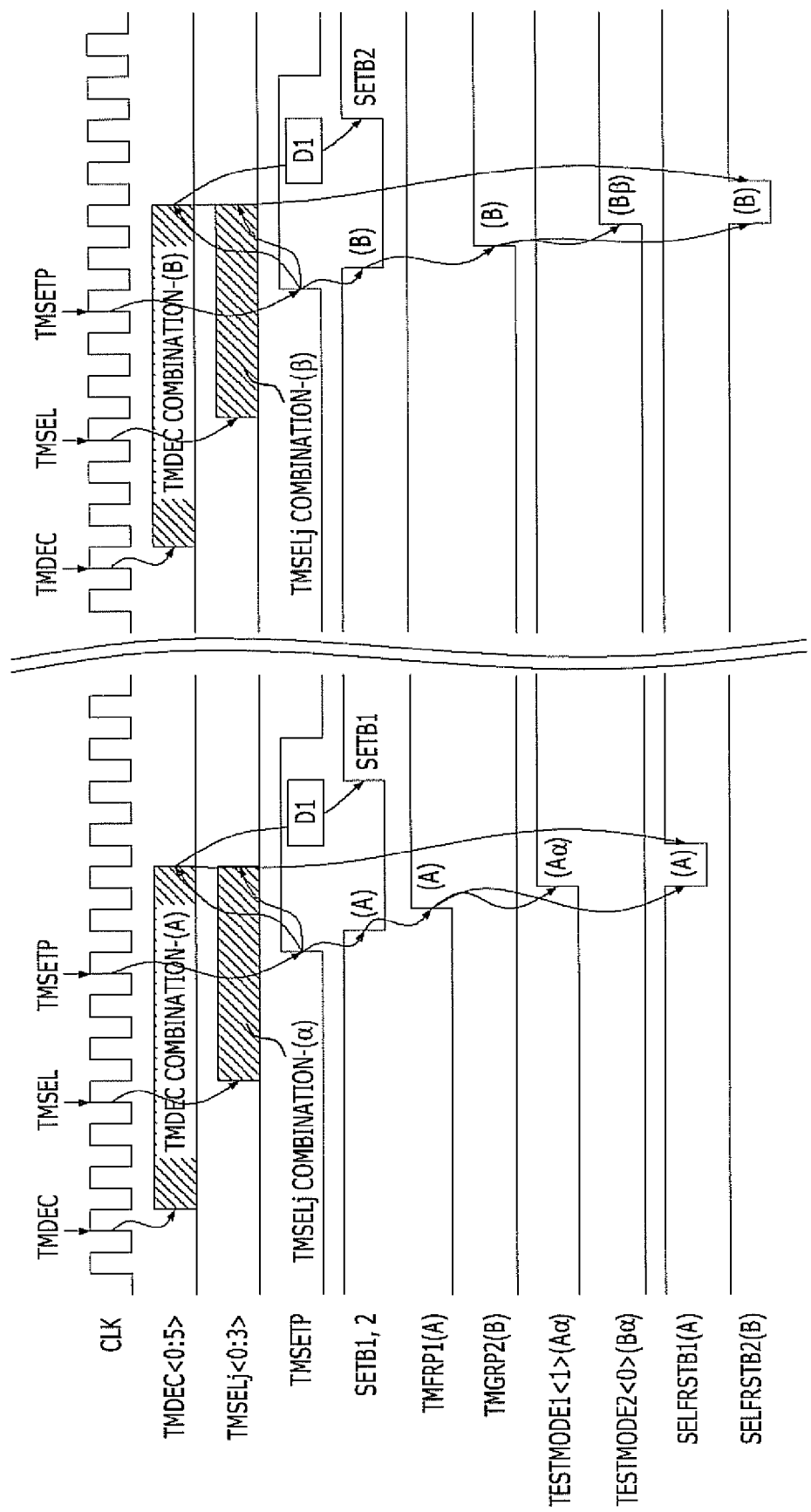
FIGS. 6 and 7 are timing diagrams illustrating a test control method of the semiconductor integrated circuit in accordance with the exemplary embodiment of the present invention.

FIG. 6 is a timing diagram illustrating the test control method of the semiconductor integrated circuit to concurrently enter test modes belonging to different test mode groups in accordance with the exemplary embodiment of the present invention.

In the exemplary embodiment of the present invention, a case that the semiconductor integrated circuit concurrently enters test modes belonging to first and second test mode groups will be described as an example.

Referring to FIG. 6, when the first test decoding signal TMDECOUT1 is activated to a logic high level by decoding a combination (A) of the 6-bit test source signal TMDEC<0:5> and the second test mode select signal TMSEL<1> is activated to a logic high level by a combination (α) of the first to fourth test mode select signals TMSEL<0:3>, only the second latch section 301B_2 included in the first output unit 301 latches and outputs a logic low level.

In such a state, when the test enable signal TMSETP is activated to a logic high level, the first test decoding pulse signal TMDECPULSE1 and the second test mode select pulse signal TMSELPULSE<1> are reset to a logic low level. That is, the first internal pulse generation section 201A generates the first test decoding pulse signal TMDECPULSE1 which is activated in response to the first test decoding signal TMDECOUT1 and deactivated in response to the test enable signal TMSETP, and the pulse generator 400 generates the second test mode select pulse signal TMSELPULSE<1> which is activated in response to the second test mode select signal TMSEL<1> and deactivated in response to the test enable signal TMSETP.

The first delay section 201B delays the first test decoding pulse signal TMDECPULSE1 by a set period and outputs the delayed first test decoding pulse signal, and the first input section 201D_1 activates the first set signal SETB1 to a logic low level during a set period, in response to the delayed first test decoding pulse signal and the test enable signal TMSETP.

Then, the first S/R latch section 201D_2 activates the first test mode group signal TMGRP1 to a logic high level in response to the first set signal SETB1 and maintains the activation state of the first test mode group signal TMGRP1 until the first self reset signal SELFRSTB1 is activated to a logic low level.

Accordingly, the first to fourth switching sections 301A_1 to 301D_1 included in the first output unit 301 are switched off to block the input of the first to fourth test mode select pulse signals TMSELPULSE<0:3>, and the first to fourth final output sections 301A_3 to 301D_3 included in the first output unit 301 are simultaneously enabled to output the first to fourth test mode signal TESTMODE1<0:3>. At this time, as only the second test mode signal TESTMODE1<1> is activated to a logic high level, a test mode corresponding to the second test mode signal TESTMODE1<1> is entered. Meanwhile, as the first test mode group signal TMGRP1 is continuously maintained, the activation state of the second test mode signal TESTMODE1<1> continues.

Subsequently, when the second test decoding signal TMDECOUT2 is activated to a logic high level in response to a new combination (B) of the 6-bit test source signal TMDEC<0:5> and the first test mode select signal TMSEL<0> is activated to a logic high level by a combination (β) of the first to fourth test mode select signals TMSEL<0:3>, only a first latch section included in the second output unit 302 latches and outputs a logic low level.

In such a state, when the test enable signal TMSETP is activated to a logic high level, a second test decoding pulse signal TMDECPULSE2 and the first test mode select pulse signal TMSELPULSE<0> are reset to a logic low level. That is, a second internal pulse generation section (not shown) generates the second test decoding pulse signal TMDECPULSE2 which is activated in response to the second test decoding signal TMDECOUT2 and deactivated in response to the test enable signal TMSETP, and the pulse generator 400 generates the first test mode select pulse signal TMSELPULSE<0> which is activated in response to the first test mode select signal TMSEL<0> and deactivated in response to the test enable signal TMSETP.

Furthermore, a second delay section (not shown) delays the second test decoding pulse signal TMDECPULSE2 by a set period and outputs the delayed second test decoding pulse signal, and a second input section (not shown) activates a second set signal SETB2 to a logic low level during a set period, in response to the delayed second test decoding pulse signal and the test enable signal TMSETP.

Then, a second S/R latch section (not shown) activates the second test mode group signal TMGRP2 to a logic high level in response to the second set signal SETB2 and maintains the activation state of the second test mode group signal TMGRP2 until a second self reset signal SELRSTB2 is activated to a logic low level.

Accordingly, first to fourth switching sections included in the second output unit 302 are switched off to block the input of the first to fourth test mode select pulse signals TMSELPULSE<0:3>, and the first to fourth final output sections included in the second output unit 302 are enabled to output the first to fourth test mode signals TESTMODE2<0:3>. At this time, as only the first test mode signal TESTMODE2<0> is activated to a logic high level, a test mode corresponding to the first test mode signal TESTMODE2<0> is entered. Meanwhile, as the second test mode group signal TMGRP2 is continuously maintained, the activation state of the first test mode signal TESTMODE1<0> continues.

When the test mode group signals TMGRP1 and TMGRP2 different from each other are sequentially activated as described above, the activation state of the previously-activated test mode group signal TMGRP1 is maintained by the S/R latch section. Accordingly, test modes belonging to different test mode groups may be concurrently entered.

Figure 7:
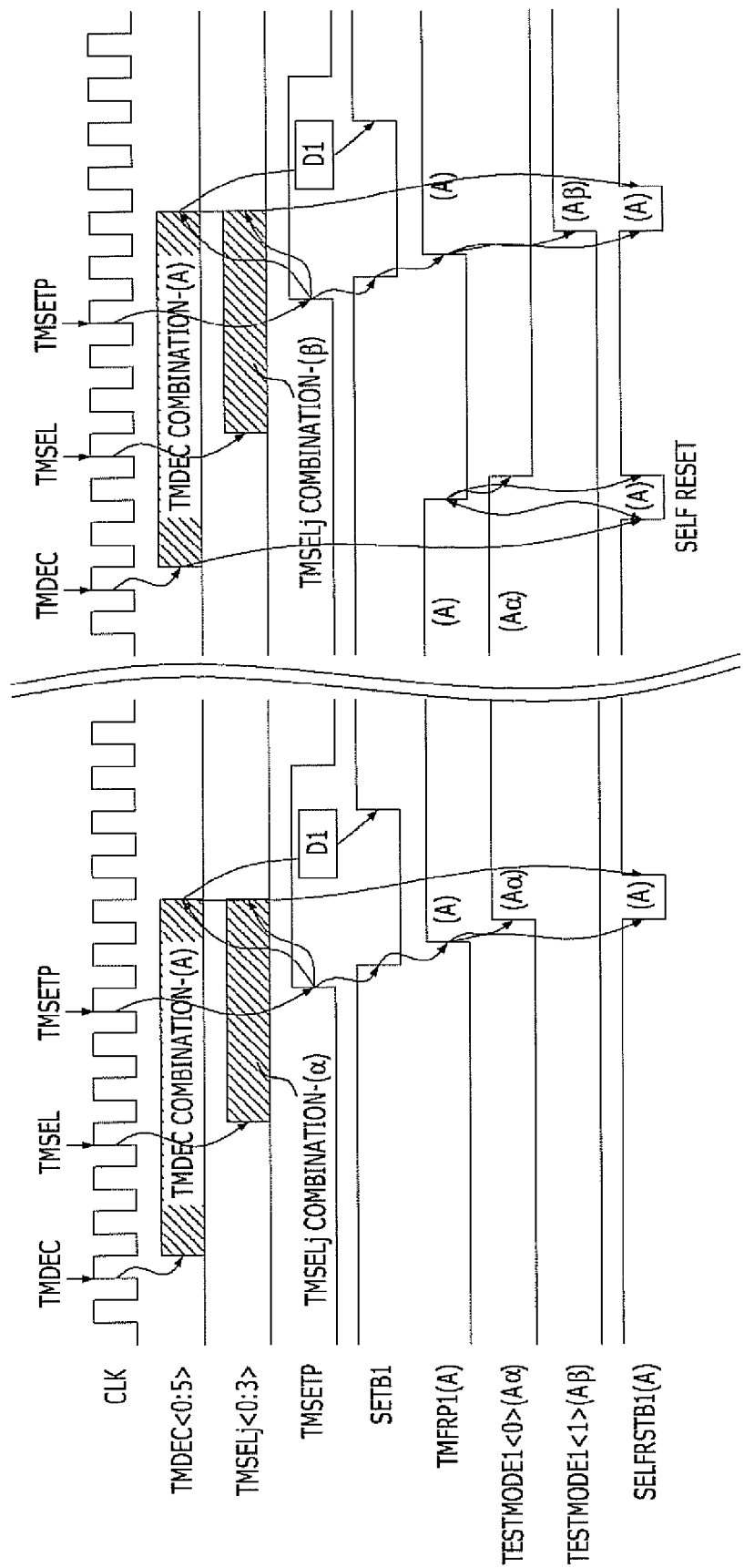

FIG. 7 is a timing diagram illustrating the test control method of the semiconductor integrated circuit in accordance with the exemplary embodiment of the present invention in order to selectively reset test modes belonging to the same test mode group.

In the exemplary embodiment of the present invention, a case that test modes belonging to the first test mode group are selectively reset will be described as an example.

Referring to FIG. 7, when the first test decoding signal TMDECOUT1 is activated to a logic high level by decoding a combination (A) of the 6-bit test source signal TMDEC<0:5> and the first test mode select signal TMSEL<0> is activated to a logic high level by a combination (α) of the first to fourth test mode select signals TMSEL<0:3>, only the first latch section 301A_2 included in the first output unit 301 latches and outputs a logic low level.

In such a state, when the test enable signal TMSETP is activated to a logic high level, the first test decoding pulse signal TMDECPULSE1 and the first test mode select pulse signal TMSELPULSE<0> are reset to a logic low level. That is, the first internal pulse generation section 201A generates the first test decoding pulse signal TMDECPULSE1 which is activated in response to the first test decoding signal TMDECOUT1 and deactivated in response to the test enable signal TMSETP, and the pulse generator 400 generates the first test mode select pulse signal TMSELPULSE<0> which is activated in response to the first test mode select signal TMSEL<0> and deactivated in response to the test enable signal TMSETP.

Furthermore, the first delay section 201B delays the first test decoding pulse signal TMDECPULSE1 by a set period and outputs the delayed first test decoding pulse signal, and the first input section 201D_1 activates the first set signal SETB1 to a logic low level during a set period, in response to the delayed first test decoding pulse signal and the test enable signal TMSETP.

Then, the first S/R latch section 201D_2 activates the first test mode group signal TMGRP1 to a logic high level in response to the first set signal SETB1 and maintains the activation state of the first test mode group signal TMGRP1 until the first self reset signal SELFRSTB1 is activated to a logic low level.

Accordingly, the first to fourth switching sections 301A_1 to 301_D included in the first output unit 301 are switched off to block the input of the first to fourth test mode select pulse signals TMSELPULSE<0:3>, and the first to fourth final output sections 301A_3 to 301D_3 included in the first output unit 301 are enabled to output the first to fourth test mode signals TESTMODE1<0:3>. At this time, as only the first test mode signal TESTMODE1<0> is activated to a logic high level, a test mode corresponding to the first test mode signal TESTMODE1<0> is entered. Meanwhile, as the first test mode group signal TMGRP1 is continuously maintained, the activation state of the first test mode signal TESTMODE1<0> continues.

Subsequently, when the first test decoding signal TMDECOUT1 is activated to a logic high level as the 6-bit test source signal TMDEC<0:5> are combined in the same manner as the previous combination (A), the first self reset signal SELFRSTB1 transits to a logic low level. The first test mode group signal TMGRP1 is reset to a logic low level in response to the first self reset signal SELFRSTB1. Accordingly, the first to fourth final output sections 301A_3 to 301D_3 included in the first output unit 301 are disabled. Therefore, the first test mode signal TESTMODE1<0> is reset to a logic low level. Meanwhile, as the first test mode group signal TMGRP1 transits to a logic low level, the first self reset signal SELFRSTB1 transits to a logic high level.

In such a state, when the second test mode select signal TMSEL<1> is activated to a logic high level by a new combination (β) of the first to fourth test mode select signals TMSEL<0:3>, only the second latch section 301B_2 included in the first output unit 301 is latches and outputs a logic low level.

Furthermore, when the test enable signal TMSETP is activated to a logic high level, the first test decoding pulse signal TMDECPULSE1 and the second test mode select pulse signal TMSELPULSE<1> are reset to a logic low level. That is, the first internal pulse generation section 201A generates the first test decoding pulse signal TMDECPULSE1 which is activated in response to the first test decoding signal TMDECOUT1 and deactivated in response to the test enable signal TMSETP, and the pulse generator 400 generates the second test mode select pulse signal TMSELPULSE<1> which is activated in response to the second test mode select signal TMSEL<1> and deactivated in response to the test enable signal TMSETP.

Furthermore, the first delay section 201B delays the first test decoding pulse signal TMDECPULSE1 by a set period and outputs the delayed first test decoding pulse signal, and the first input section 201D_1 activates the first set signal SETB to a logic low level during a set period, in response to the delayed first test decoding pulse signal and the test enable signal TMSETP.

Then, the first S/R latch section 201D_2 activates the first test mode group signal TMGRP1 to a logic high level in response to the first set signal SETB and maintains the activation state of the first test mode group signal TMGRP1 until the first self reset signal SELFRSTB1 is activated to a logic low level.

Accordingly, the first to fourth switching sections 301A_1 to 301D_1 included in the first output unit 301 are switched off to block the input of the first to fourth test mode select pulse signals TMSELPULSE<0:3>, and the first to fourth final output sections 301A_3 to 301D_3 included in the first output unit 301 are simultaneously enabled to activate only the second test mode signal TESTMODE1<1> of the first to fourth test mode signals TESTMODE1<0:3> to a logic high level. Accordingly, a test mode corresponding to the second test mode signal TESTMODE1<1> is entered. Meanwhile, as the first test mode group signal TMGRP1 is continuously maintained, the activation state of the second test mode signal TESTMODE1<1> continues.

When the semiconductor integrated circuit enters test modes belonging to the same test mode group successively as described above, the first to fourth test mode select signals TMSEL<0:3> are generated in a new combination while a previous test mode group signal (for example, TMGRP1) is deactivated by a self reset function. Accordingly, the test modes belonging to the same test mode group may be selectively reset.

FIG. 8 is a table showing results of the test control method of the semiconductor integrated circuit illustrated in FIGS. 6 and 7. As shown in FIG. 8, the semiconductor integrated circuit may concurrently enter a test mode TESTMODE_2_0 belonging to the second test mode group TMGRP2, in a state of entering test modes TESTMODE_1_0 and TESTMODE_1_1 belonging to the first test mode group TMGRP1 (FIG. 6). Furthermore, the test mode TESTMODE_1_0 belonging to the first test mode group TMGRP1 may be selectively reset, and the other test mode TESTMODE_1_1 belonging to the same test mode group TMGRP1 is entered (FIG. 7).

In accordance with the embodiment of the present invention, test modes belonging to different test mode groups may be concurrently entered, and any test mode among a plurality of test modes belonging to the same test mode group may be selectively reset.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
   a decoding circuit configured to decode one or more test source signals and generate a plurality of test decoding signals;
   a transmission circuit configured to transmit the plurality of test decoding signals as a plurality of test mode group signals in response to a test enable signal, such that when the test decoding signals different from each other are sequentially activated, the transmission circuit outputs a corresponding newly-activated test mode group signal while maintaining an activation state of a previously-activated test mode group signal; and
   a test mode signal output circuit configured to output a plurality of test mode signals corresponding to a plurality of test mode groups, respectively, in response to the plurality of test mode group signals and one or more test mode select signals,
   wherein test modes belonging to different test mode groups are concurrently entered due to the corresponding newly-activated test mode group signal being output and the activation state of the previously-activated test mode group signal being maintained, and any test modes belonging to a same test mode group are selectively reset.

2. The semiconductor integrated circuit of claim 1, wherein the transmission circuit is configured to output the test mode group signals while resetting the previous output, when the same test decoding signals are sequentially activated, the transmission circuit outputs the corresponding newly-activated test mode group signal while resetting the previously-activated test mode group signal.

3. The semiconductor integrated circuit of claim 2, wherein when the same test decoding signal is sequentially activated, the transmission circuit intermittently deactivates and activates a corresponding test mode group signal by a self reset function.

4. The semiconductor integrated circuit of claim 3, wherein the transmission circuit comprises a plurality of transmission units corresponding to the plurality of test mode group signals.

5. The semiconductor integrated circuit of claim 4, wherein each of the transmission units comprises:
   an internal pulse generation section configured to output a test decoding pulse signal which is activated in response to one of the test decoding signals and deactivated in response to the test enable signal;
   a self reset section configured to generate a self reset signal in response to the test decoding pulse signal and one of test mode group signals outputted from the transmission unit; and
   a test mode group signal generation section configured to generate the test mode group signal in response to the self reset signal, the test enable signal, and the test decoding pulse signal.

6. The semiconductor integrated circuit of claim 5, wherein the test mode group signal generation section comprises:
   an input section configured to receive the test decoding pulse signal in response to the test enable signal; and
   an S/R latch section configured to be set in response to an output signal of the input section and reset in response to the self reset signal.

7. The semiconductor integrated circuit of claim 6, wherein the S/R latch section is reset in response to a common reset signal.

8. The semiconductor integrated circuit of claim 5, wherein each of the transmission units further comprises a delay section configured to delay the test decoding pulse signal by a set period and output the delayed test decoding pulse signal to the test mode group signal generation section.

9. The semiconductor integrated circuit of claim 2, further comprising a pulse generator configured to generate the test mode select signals in a pulse form in response to the test enable signal and one or more test mode select source signals.

10. The semiconductor integrated circuit of claim 2, wherein the test mode signal output circuit comprises a plurality of output units corresponding to the plurality of test mode group signals transmitted from the transmission circuit.

11. The semiconductor integrated circuit of claim 10, wherein each of the output units comprises:
   one or more switching sections configured to selectively transmit the respective test mode select signals in response to one of the test mode group signals outputted from the transmission circuit;
   one or more latch sections configured to latch the respective test mode select signals which are selectively transmitted through the switching sections; and
   one or more final output sections configured to output one or more test mode signals of the test mode signals in response to the respective test mode select signals latched in the latch sections and the test mode group signal transmitted from the transmission circuit.

12. A test control method of a semiconductor integrated circuit, comprising:
   activating a first test mode group signal among a plurality of test mode group signals for a first test mode group including a plurality of first test modes;
   latching the first test mode group signal;
   activating a first test mode signal for entering one or more of the first test modes, in response to a plurality of test mode select signals and the first test mode group signal latched in the latching of the first test mode group signal;
   activating a second test mode group signal among the plurality of test mode group signals for a second test mode group including a plurality of second test modes;
   latching the second test mode group signal; and
   activating a second test mode signal for entering one or more of the second test modes, in response to the plurality of test mode select signals and the second test mode group signal latched in the latching of the second test mode group signal,
   wherein, in the activating of the second test mode group signal, the latching of the second test mode group signal, and the activating of the second test mode signal, the first test mode signal is maintained to be activated,
   wherein when the first test mode group signal and the second test mode signal different from each other are sequentially activated, the test mode group signals are outputted to maintain a previous output,
   wherein the test modes belonging to different test mode groups of the first and second test mode groups are concurrently entered, and any test modes belonging to a same test mode group of the first test mode or the second test mode are selectively reset.

13. The test control method of claim 12, wherein the activating of the first and second test mode group signals comprises:
   decoding one or more test source signals and generating first and second test decoding signals, respectively; and
   generating the first and second test mode group signals, respectively, which are activated in response to the first and second test decoding signals and deactivated in response to a test enable signal.

14. The test control method of claim 12, wherein when a common reset signal is activated, the first and second test mode signals are deactivated.

15. A test control method of a semiconductor integrated circuit, comprising:
   activating a first test mode group signal of a first period among a plurality of test mode group signals for a first test mode group including a plurality of test modes;
   first latching the first test mode group signal;
   activating a first test mode signal for entering one of the test modes, in response to a plurality of test mode select signals and the first test mode group signal latched in the first latching of the activating the first test mode group signal;
   activating the first test mode group signal of a second period;
   deactivating the first test mode signal in response to the first test mode group signal of the second period, and second latching the first test mode group signal of the second period; and
   activating a second test mode signal for entering another of the test modes, in response to the test mode select signals and the first test mode group signal latched in the second latching,
   wherein when the first test mode group signal and the second test mode signal different from each other are sequentially activated, a corresponding newly-activated second test mode group signal is output while an activation state of a previously-activated first test mode group signal is maintained,
   wherein the test modes belonging to different test mode groups of the first and second test mode groups are concurrently entered due to the corresponding newly-activated second test mode group signal being output and the activation state of the previously-activated first test mode group signal being maintained, and any test modes belonging to a same test mode group of the first test mode or the second test mode are selectively reset.

16. The test control method of claim 15, wherein the activating of the first test mode group signal of first and second periods comprises:
   decoding one or more test source signals and generating a first test decoding signal; and
   generating the first test mode group signal which is activated in response to the first test decoding signal and deactivated in response to a test enable signal.

17. The test control method of claim 15, wherein the activating of the second test mode signal comprises maintaining the first test mode signal to be deactivated.

* * * * *